United States Patent
Cheng et al.

(10) Patent No.: US 7,708,356 B2
(45) Date of Patent: May 4, 2010

(54) HOST UNIT CASE WITH FOLDABLE FRONT AND REAR WALLS AND LOWER COVER FOR A COMPUTER

(75) Inventors: Sheng-Hsiung Cheng, Taipei Hsien (TW); Te-An Lin, Taipei Hsien (TW); Wu-Nan Wang, Taipei Hsien (TW); Chia-Chia Huang, Taipei Hsien (TW)

(73) Assignee: Aopen Inc., Hsichih, Taipei Hsien (TW)

( * ) Notice: Subject to any disclaimer, the term of this patent is extended or adjusted under 35 U.S.C. 154(b) by 498 days.

(21) Appl. No.: 11/655,280

(22) Filed: Jan. 19, 2007

(65) Prior Publication Data

US 2007/0253154 A1 Nov. 1, 2007

(30) Foreign Application Priority Data

Apr. 26, 2006 (TW) .............................. 95114986 A

(51) Int. Cl.
H05K 7/16 (2006.01)
(52) U.S. Cl. .................................... 312/223.2; 312/258
(58) Field of Classification Search ................ 312/258, 312/223.2, 262; 220/6, 7, 666; 361/679.02, 361/679.31, 679.6, 679.33
See application file for complete search history.

(56) References Cited

U.S. PATENT DOCUMENTS

| | | | | |
|---|---|---|---|---|
| 4,057,165 A * | 11/1977 | Kardell | ........................... | 220/6 |
| 4,949,850 A * | 8/1990 | Weathers | ................... | 211/69.7 |
| 5,862,931 A * | 1/1999 | Cox et al. | ...................... | 220/6 |
| 5,913,583 A * | 6/1999 | Zachoszcz | ................... | 312/263 |
| 5,975,659 A * | 11/1999 | Yang et al. | ............... | 312/223.2 |
| 6,097,591 A * | 8/2000 | Ircha | ....................... | 361/679.6 |
| 6,288,332 B1 * | 9/2001 | Liu et al. | .................... | 174/542 |
| 6,382,744 B1 * | 5/2002 | Xiao | ....................... | 312/223.2 |
| 6,530,628 B1 * | 3/2003 | Huang et al. | ............. | 312/223.2 |
| 6,826,039 B2 * | 11/2004 | Chen | ...................... | 361/679.3 |
| 6,870,739 B2 * | 3/2005 | Groos et al. | ................ | 361/725 |
| 7,151,672 B2 * | 12/2006 | Campbell | ................... | 361/725 |
| 7,248,464 B1 * | 7/2007 | Chiang | ................. | 361/679.55 |
| 7,283,363 B2 * | 10/2007 | Lee | ............................. | 361/707 |
| 7,518,866 B2 * | 4/2009 | Cheng et al. | ................ | 361/697 |
| 2007/0152414 A1 * | 7/2007 | Home | ..................... | 280/47.35 |
| 2007/0228900 A1 * | 10/2007 | Cheng et al. | ............ | 312/223.2 |
| 2007/0242422 A1 * | 10/2007 | Cheng et al. | ................ | 361/683 |
| 2007/0252495 A1 * | 11/2007 | Cheng et al. | ................ | 312/350 |
| 2008/0001508 A1 * | 1/2008 | Cheng et al. | ............ | 312/223.2 |

(Continued)

FOREIGN PATENT DOCUMENTS

TW 388594 4/2000

(Continued)

*Primary Examiner*—Janet M Wilkens

(57) ABSTRACT

A host unit case with foldable front and rear walls and lower cover for a computer includes a front wall, a rear wall, an upper cover and a lower cover. The lower end of the front wall connects with the front end of the lower cover. The lower end of rear wall pivotally connects with the rear end of the lower cover. Hence, the lower cover, the front wall and the rear wall are unfolded to allow the lower cover engaging with upper end of the front wall and upper end of the rear wall for the host unit case being set up as a complete form quickly and being folded parts thereof to reduce the volume thereof conveniently.

5 Claims, 5 Drawing Sheets

U.S. PATENT DOCUMENTS

| | | | |
|---|---|---|---|
| 2008/0002349 A1* | 1/2008 | Cheng et al. | 361/685 |
| 2008/0073341 A1* | 3/2008 | Avery | 220/9.4 |
| 2008/0277402 A1* | 11/2008 | Lowrey | 220/666 |
| 2009/0268399 A1* | 10/2009 | Chou | 361/679.55 |

FOREIGN PATENT DOCUMENTS

| | | |
|---|---|---|
| TW | 539388 | 6/2003 |
| TW | M282222 | 12/2005 |

\* cited by examiner

HOST UNIT CASE WITH FOLDABLE FRONT AND REAR WALLS AND LOWER COVER FOR A COMPUTER

BACKGROUND OF THE INVENTION

1. Field of the Invention

The present invention is related to a host unit case of a personal computer and particularly to a built-up type host unit case of a computer.

2. Brief Description of Related Art

The host unit case is employed to receive electronic devices such as a main board, hard disks, optical disk drives, floppy disk drives and power supply device. Usually, the host unit case is set up with an unchangeable structure. The composite type host unit case has prior art such as U.S. Pat. No. 6,961,236 and Taiwan Utility model publication No. M258544. U.S. Pat. No. 6,961,236 discloses a computer chassis and Taiwan Utility model publication No. M258544 discloses a host unit case to meet specifications of ATX and BTX.

Following prior art is belonged to a further type for the host unit case is made available for being disassembled into several parts before being set up as the host unit case. Taiwan Patent Publication Nos. 468811 discloses a host unit case for an industrial computer. Taiwan Patent Publication No. 474423 discloses a computer chassis free from aid of hand tools. Taiwan Patent Publication No. 490120 discloses a composite type computer chassis. Taiwan Patent Publication No. 531142 discloses a composite type computer chassis assembly.

Further, the computer chassis free from aid of hand tools disclosed in Taiwan Patent Publication No. 474423 provides the front and rear cover plates, which are pivotally joined to a bottom plate with head pins, two frame plates for a big floppy disk drive, which are pivotally joined to the front and rear cover plates, and a cover plate for a small floppy disk drive is assembled to a frame plate and is fixedly hung to the bottom of frame plate for the big floppy disk drive. Further, four L shaped plates are fixed at four corners of the bottom plate to be joined to the two cover plates firmly. Finally, two lateral cover plates are hooked to the lateral sides of the preceding structure and fastened with set screws after the main board and the power supply frame being mounted to the preceding structure to complete the whole assembly of the computer chassis. The parts of the computer chassis are packaged separately such that less space is required for storage.

However, parts of the preceding prior art are so many and divided into several part groups and it is inconvenient to pick right parts during setting up the computer chassis such that it is hard to gather the parts before assembling and it takes a lot of time set up the computer chassis.

SUMMARY OF THE INVENTION

The crux of the present invention is to develop a host unit case, which is capable of being folded and set up more conveniently for being favorable for reduction of delivery cost and economy of storage space.

The primary object is to provide a host unit case with foldable front and rear walls and lower cover for a computer with which the host unit case can be completely set up easily and quickly to enhance fun while the host unit case being set up by the user.

Another object is to provide a host unit case with foldable front and rear walls and lower cover for a computer with which the parts can be gathered together and reduced in a small volume while packaging for reducing delivery cost and saving storage space.

Accordingly, a host unit case with foldable front and rear walls and lower cover for a computer according to the present invention is capable of being reduced volume thereof while packaging and being completely set up conveniently and quickly and comprises:

a lower cover;

a front wall, the lower end thereof pivotally connecting with front end of the lower cover;

a rear wall, the lower end thereof pivotally connecting with rear end of the lower cover; and an upper cover;

wherein, the lower cover, the front wall and the rear wall are unfolded to allow the lower cover engaging with upper end of the front wall and upper end of the rear wall for the host unit case being set up as a complete form quickly and being folded parts thereof to reduce the volume thereof conveniently.

The present invention can be more fully understood by reference to the following description and accompanying drawings, in which:

DETAILED DESCRIPTION OF THE INVENTION

Figure 1:
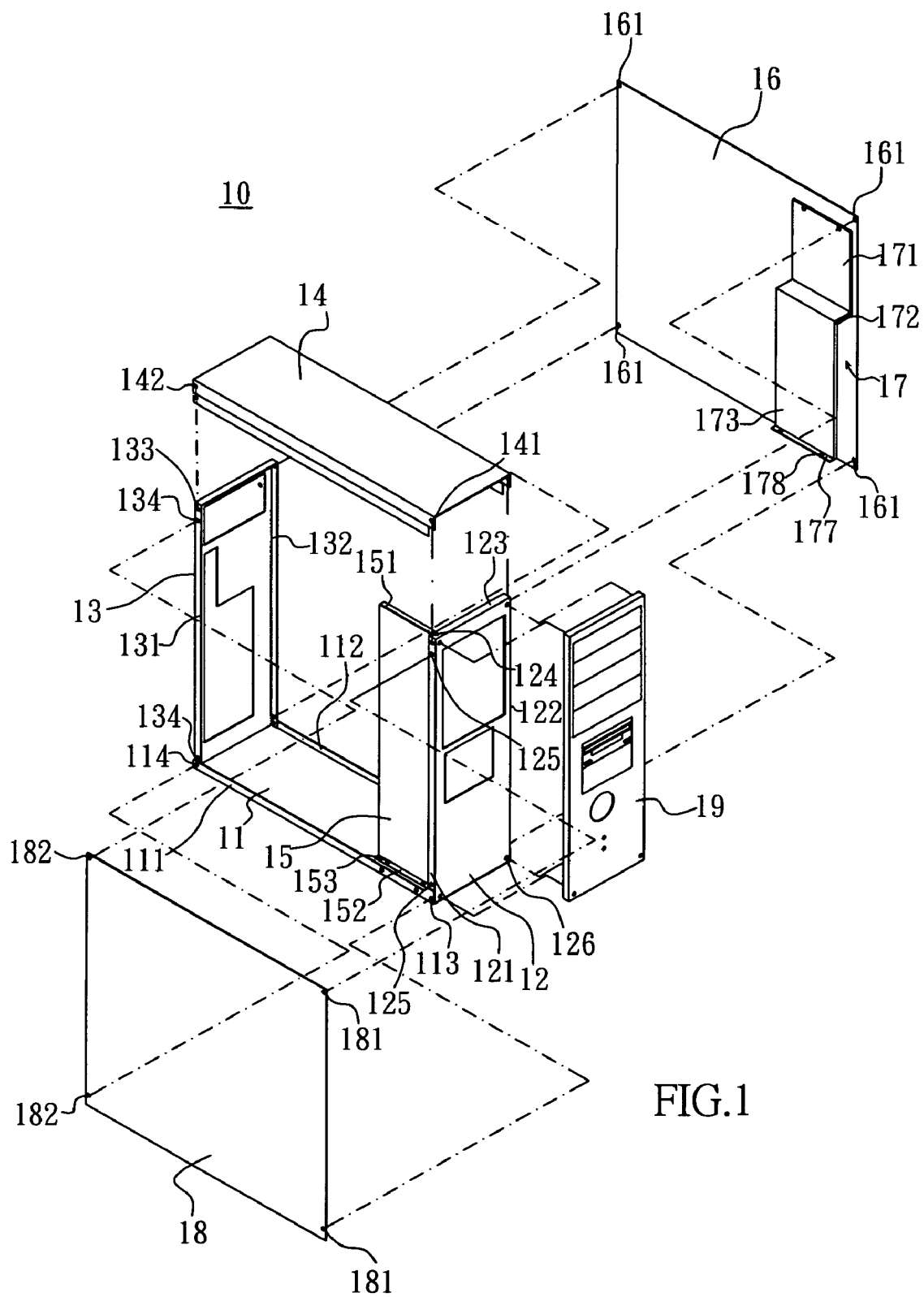
FIG. 1 is an exploded perspective view of a preferred embodiment of a host unit case with foldable front and rear walls and lower cover for a computer according to the present invention.
Figure 2A:
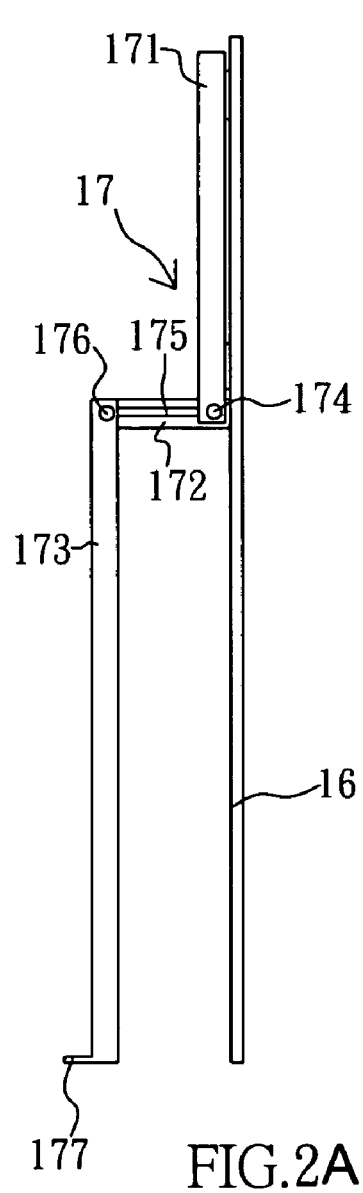
FIG. 2A is a plan views illustrating the first step for folding the first lateral wall and the second support frame member.
Figure 2B:
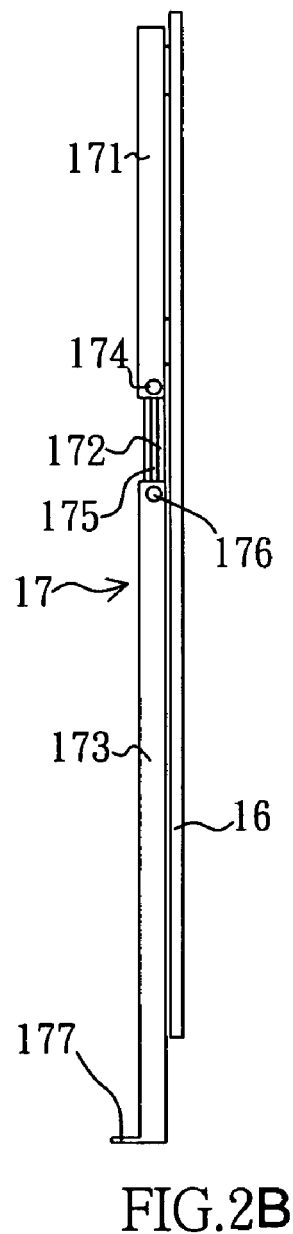
FIG. 2B is a plan views illustrating the second step for folding the first lateral wall and the second support frame member.
Figure 2C:
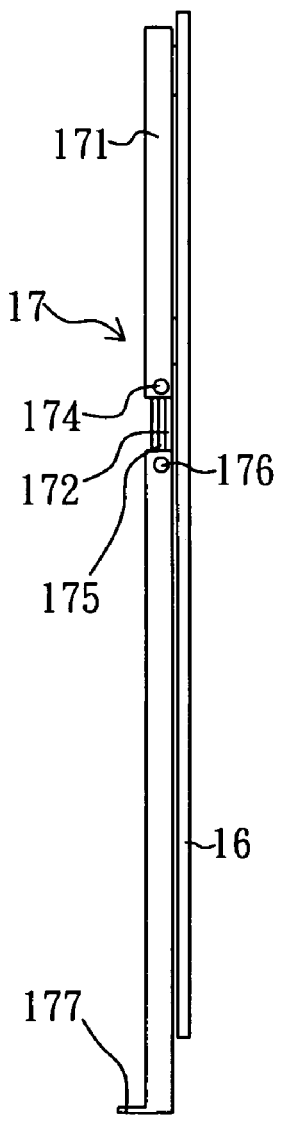
FIG. 2C is a plan views illustrating the third step for folding the first lateral wall and the second support frame member.

Referring to FIG. 1, a host unit case with foldable front and rear walls and lower cover according to the present invention the present invention is capable of being reduced volume thereof for packaging and being unfolded as a complete host unit case conveniently and quickly. The host unit case 10 of the present invention includes:

a lower cover 11, which has a left frame edge 111 and a right frame edge 112 extending from the left lateral side and the right lateral side thereof;

a front wall 12, which has a left frame edge 121 and a right frame edge 122 at the left lateral side and the right lateral side thereof corresponding to left frame edge 111 and the right frame edge 112 of the lower cover 11 and has a frame edge 123 at the upper and lower ends thereof, wherein the frame edges 121, 122 is disposed at the inner side of the frame edges 111, 112 of the lower cover 11 with the frame edge 123 having holes corresponding to holes at the frame edges 111, 112 such that the lower end of the front wall 12 pivotally connects with the front end of the lower cover 11 by means of pivotal shafts 113 passing the corresponding holes;

a rear wall 13, which has a left frame edge 131 and a right frame edge 132 at the left lateral side and the right lateral side thereof corresponding to left frame edge 111 and the right frame edge 112 of the lower cover 11, wherein the frame edges 131, 132 is disposed at the inner side of the frame edges 111, 112 of the lower cover 11 with the frame edge 131, 132 having holes corresponding to holes at the frame edges 111, 112 such that the lower end of the rear wall 13 pivotally connect with the rear end of the lower cover 11 by means of pivotal shafts 114 passing the corresponding holes;

an upper cover 14, which has holes 141 corresponding to the holes of the front wall 12 such that the upper cover 14 engages with the upper end of the front wall 12 by means of screws passing through the corresponding holes; the upper cover 14 has holes 142 and the rear wall 13 has holes 133 corresponding to the holes 142 such that the upper cover 14 engages with the upper end of the rear wall 13 by means of screws;

a first support member 15, which has a strip 151, 152 at the upper side and the lower side thereof being disposed at the inner side of the frame edge 123 at the upper end and the lower end of the front wall 12; the strips 151, 152 have holes and the frame edges 123 has holes corresponding to the holes at the stripes 151, 152 such that an end of the first support member 15 is pivotally joined to the second end of the front wall 12 by means of pivotal shafts 124 passing through the corresponding holes and another end of the first support member 15 is capable of being lifted from pressing the first end of the front wall 12; the strip 152 at the lower end of the first support member 15 has holes 153 corresponding to holes at the lower cover 11 such that the lower end of the first support member 15 engages with the lower cover 11 by means of screws passing through the corresponding holes 153 while the first support member 15 is lifted;

a first lateral wall 16, which has holes corresponding to the holes at the front wall 12, the rear wall 13 for engaging with the front wall 12 and the rear wall 13 by means of screws passing through the corresponding holes;

a second support member 17, which has a first plate 171, a second plate 172 and a third plate 173 pivotally connecting with each other sequentially as shown in FIGS. 2A, 2B and 2C, wherein the first plate 171 is joined to the inner side of the first lateral wall 16, the lower end of the first plate 171 pivotally connects with the second plate 173 by means of a first pivotal shaft 174, the upper end of the third plate 173 pivotally connects with an elongated slot 175 at the second plate 172 by means of a second pivotal shaft 176 such that the third plate 173 is capable of extending toward the first support member 15 or folding toward the first lateral wall 16 for both of the second plate 172 and the third plate 173 closely contacting with the first lateral wall 16 and for the third plate 173 moving more closely to the first plate 171 due to the second pivotal shaft 176 being capable of moving in the elongated slot 175 as shown in FIGS. 2B and 2C; the lower end of the third plate 173 has an angle side 177 with holes corresponding to holes at the lower cover 11 such that the third plate 173 is capable of engaging with the lower cover 11 by means of screws passing through the corresponding holes;

a second lateral wall 18, which has holes 181, 182 corresponding to a hole 125 at the front wall 12 and a hole 134 at the rear wall 13 respectively for engaging with the front wall 12 and the rear wall 13 by means of screws passing through the corresponding holes; and a front panel 19, which has engaging projections corresponding to a plurality of holes 126 at the front wall 12 such that the front panel 19 engages with the front wall by means of the projections engaging with the holes 126.

Figure 4A:
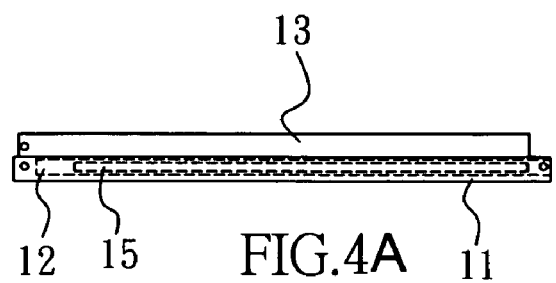
FIG. 4A is a side elevational views illustrating the first step for unfolding the lower cover, the front wall and the rear wall according to the present invention.

Referring to FIGS. 1 and 4A, when the host unit case 10 of the preferred embodiment is packaged, the front panel 19, the second lateral wall 18, the first lateral wall 16 and the upper cover 14 are in a state of being detached from the front wall 12 and the rear wall 13. Thus, the first support member 15 closely contacts the front wall 12, the front wall 12 closely contacts the lower cover 11 and the rear wall 13 closely contacts the front wall 12 as shown in FIG. 4A. Therefore, space occupied by the detached host unit case 10 is reduced greatly.

Figure 3:
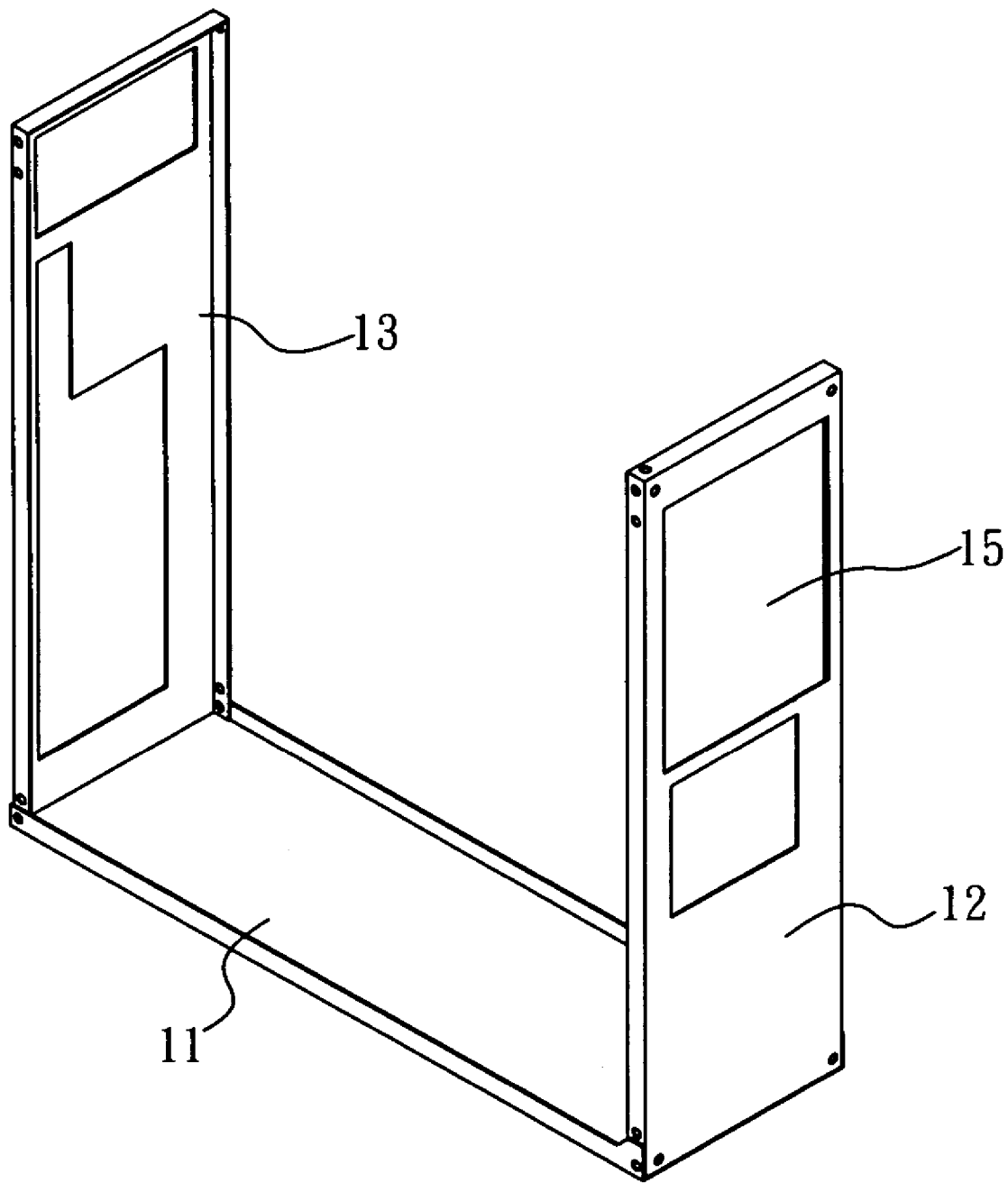
FIG. 3 is a perspective view illustrating the lower cover, the front wall and the rear wall being unfolded according to the invention.
Figure 4B:
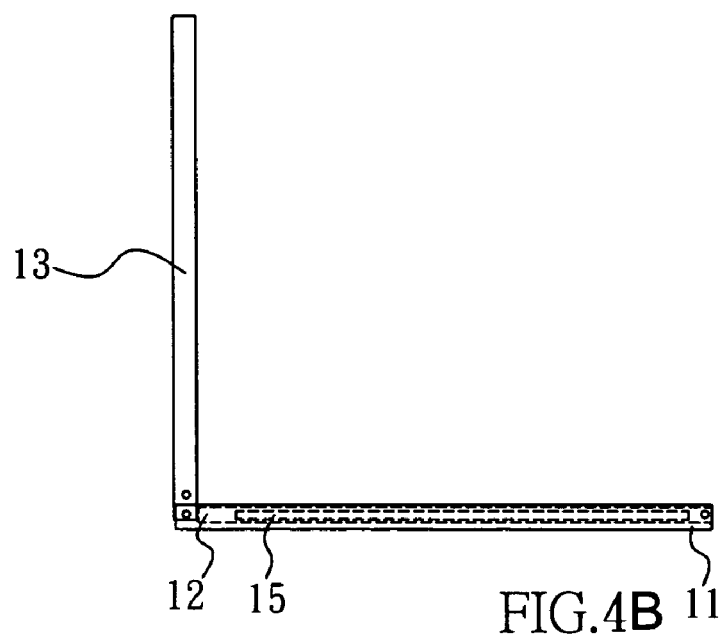
FIG. 4B is a side elevational views illustrating the second step for unfolding the lower cover, the front wall and the rear wall according to the present invention.
Figure 4C:
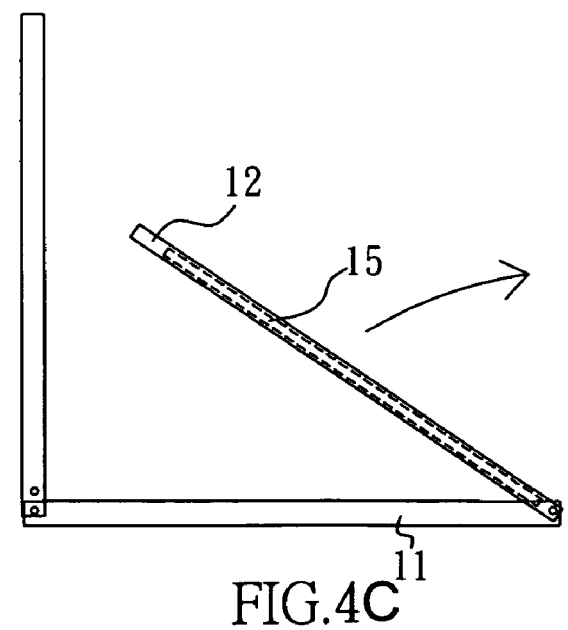
FIG. 4C is a side elevational views illustrating the third step for unfolding the lower cover, the front wall and the rear wall according to the present invention.
Figure 5:
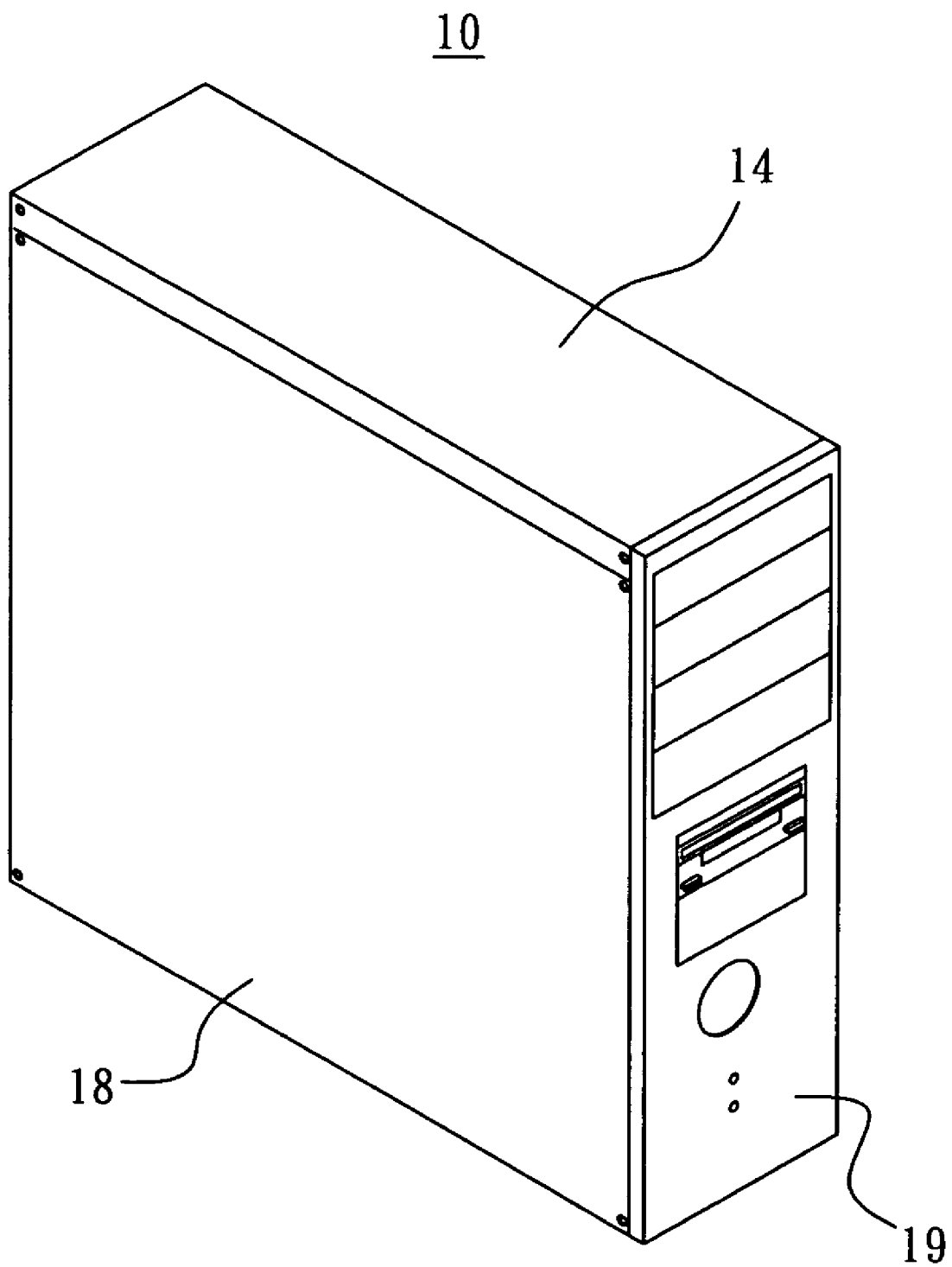
FIG. 5 is a perspective view of the preferred embodiment of the present invention.

Referring to FIGS. 1, 3, 4A, 4B, 4C and 5 when the host unit case 10 of the preferred embodiment is unfolded, the rear wall 13 is lifted first as shown in FIG. 4B and then the front wall 12 is lifted as shown in FIG. 4C for the lower cover 11, the front wall 12 and the rear wall 13 become in a state of being extended as shown in FIG. 3. Further, the first support member 15 is lifted to engage with the lower cover 11 before the first lateral wall 16, the second lateral wall 18, the upper cover 14 and the front panel 19 engaging with the front wall 12 and the rear wall 13. Afterward, the second support member 17 is unfolded to form a completely set up host unit case 10 as shown in FIG. 5.

The first support member 15 spaces apart the first plate 171 a longer distance for being associated with first electronic device such as 5.25" disk drive and the first support member 15 spaces apart the third plate 173 of the second support member 17 a shorter distance for being associated with second electronic device such as 3.25" disk drive.

It is appreciated that the host unit case with foldable rear wall and lower cover for a computer according to the present invention is capable of being conveniently set up as a complete host unit case quickly to enhance fun with self setting up the host unit case and is capable of being folded as a reduced volume for decreasing delivery cost and saving available storage space.

While the invention has been described with referencing to a preferred embodiment thereof, it is to be understood that modifications or variations may be easily made without departing from the spirit of this invention, which is defined by the appended claims.

What is claimed is:

1. A host unit case with foldable front and rear walls and lower cover for a computer comprising:
   the lower cover having a front end and a rear end;
   the front wall having an upper end, a first lower end, a first lateral side and a second lateral side, and said first lower end pivotally connecting with said front end;
   the rear wall having a second lower end pivotally connecting with said rear end;
   an upper cover;
   a plate-shaped first support member pivotally connecting with said first lateral side;
   a first lateral wall being joined to said front wall and said rear wall respectively; and
   a second lateral wall being opposite to said first lateral wall and joined to said front wall and said rear wall respectively;
   wherein the front wall has a frame edge at the upper end and said first lower end respectively; the first support member has a strip at the upper side and the lower side thereof respective; the strip has a hole and the frame edge has a hole corresponding to the hole of the respective strip such that the first support member is pivotally joined to the front wall by means of a pivotal shaft passing through the corresponding holes.

2. The host unit case with foldable front and rear walls and lower cover for a computer as defined in claim 1, wherein the strip at the lower end of the first support member has a hole corresponding to a hole of the lover cover such that the lower end of the first support member engages with the lower cover by means of a screw passing through the corresponding holes.

3. The host unit case with foldable front and rear walls and lower cover for a computer as defined in claim 1 further comprises a second support member, which has a first plate, a second plate and a third plate being joined to each other sequentially, wherein the first plate is joined to an inner side of the first lateral wall, the first plate has a third lower end joined to the second plate by means of a first pivotal shaft, an upper end of the third plate is joined to another end of the second plate, the third plate is closer to the first support member than the first plate such that a first electronic device is arrangeable between the first support member and the first plate and a second electronic device is arrangeable between the first support member and the third plate.

4. The host unit case with foldable front and rear walls and lower cover for a computer as defined in claim 3, wherein; the upper end of the third plate pivotally connects with an elongated slot at the second plate by means of a second pivotal shaft such that the third plate is capable of extending toward the first support member.

5. The host unit case with foldable front and rear walls and lower cover for a computer as defined in claim 3, wherein the third plate has a fourth lower end, which has an angle side with holes corresponding to holes at the lower cover such that the third plate is capable of engaging with the lower cover by means of screws passing through the corresponding holes.

* * * * *